United States Patent
Wu et al.

(10) Patent No.: US 7,508,667 B2
(45) Date of Patent: Mar. 24, 2009

(54) HEAT SINK BACKPLATE MODULE, CIRCUIT BOARD, AND ELECTRONIC APPARATUS HAVING THE SAME

(75) Inventors: Chun-Chieh Wu, Taipei (TW); Hung-Chun Chu, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 11/836,787

(22) Filed: Aug. 10, 2007

(65) Prior Publication Data

US 2008/0123295 A1    May 29, 2008

(30) Foreign Application Priority Data

Nov. 29, 2006    (TW) .............................. 95144165 A

(51) Int. Cl.
H05K 7/20    (2006.01)
F28F 7/00    (2006.01)
H01L 23/34    (2006.01)

(52) U.S. Cl. .................. 361/697; 165/104.33; 165/121; 165/80.3; 165/185; 257/719; 361/700; 361/719

(58) Field of Classification Search ................. 361/697, 361/699–704, 719; 165/80.4–80.5, 104.33, 165/185; 174/16.3
See application file for complete search history.

(56) References Cited

U.S. PATENT DOCUMENTS

| 6,760,225 | B1 | 7/2004 | Chen et al. |
| 6,937,474 | B2 | 8/2005 | Lee |
| 7,209,356 | B2 * | 4/2007 | Lee et al. .................... 361/719 |
| 7,283,364 | B2 * | 10/2007 | Refai-Ahmed et al. ...... 361/719 |
| 2006/0039117 | A1 * | 2/2006 | Lee et al. .................... 361/719 |
| 2006/0114657 | A1 * | 6/2006 | Refai-Ahmed et al. ...... 361/719 |
| 2006/0126304 | A1 | 6/2006 | Smalc et al. |
| 2006/0146496 | A1 | 7/2006 | Asfia et al. |
| 2006/0175045 | A1 | 8/2006 | Chen |
| 2007/0146995 | A1 * | 6/2007 | Zhao et al. .................. 361/697 |
| 2007/0217162 | A1 * | 9/2007 | Zhou et al. .................. 361/710 |

* cited by examiner

*Primary Examiner*—Gregory D Thompson
(74) *Attorney, Agent, or Firm*—Jianq Chyun IP Office

(57) ABSTRACT

An electronic apparatus includes a case, a circuit board disposed in the case, a heat sink backplate module, and a heat sink disposed on a heat source of the circuit board. The heat sink backplate module is disposed on a surface of the circuit board opposite to the heat source. The heat sink backplate module includes a body having a plurality of holes, at least a heat pipe, a fins assembly, and a heat spreader. The pluralities of fixing elements of the heat sink are fixed in the holes such that the heat sink is disposed firmly on the heat source. The heat spreader is disposed on a surface close to the circuit board. The heat pipe passing through the body is suitable for heat conducting from the bottom of the circuit board to the fins assembly so that the temperature of the bottom of the circuit board is decreased.

6 Claims, 7 Drawing Sheets

HEAT SINK BACKPLATE MODULE, CIRCUIT BOARD, AND ELECTRONIC APPARATUS HAVING THE SAME

CROSS-REFERENCE TO RELATED APPLICATION

This application claims the priority benefit of Taiwan application serial no. 95144165, filed Nov. 29, 2006. All disclosure of the Taiwan application is incorporated herein by reference.

BACKGROUND OF THE INVENTION

1. Field of the Invention

The invention relates to a backplate module and, more particularly, to a heat sink backplate module and circuit board and electronic apparatus having the same.

2. Description of the Related Art

With the rapid development of electronic industry, it is very important to pay more attention in radiation processing of the electronic elements. For example, the Central Processing Unit (CPU) produces more heat when its operation rate is higher. It is normal to dispose a heat sink on the CPU of a motherboard for reducing the working temperature of the CPU. The size and weight of the heat sink of the CPU tend to increase to satisfy the heat dissipation demand of the CPU.

Under a high-temperature for a long time, the motherboard may deform since the gravity force of the heat sink pulls the motherboard downward. Therefore, the motherboard may be easy to break due to shaking and other unpredictable external force. To avoid this situation, a common solution is to assemble a heat sink backplate at the back of the motherboard to improve structure strength of the motherboard and dispose the heat sink firmly to the surface of the CPU.

Note that the heat from the CPU is not only dissipated by the heat sink but also conducted to the bottom of the motherboard. It may cause the high temperature of the bottom of the motherboard, which results in that some elements of the motherboard can not work regularly.

BRIEF SUMMARY OF THE INVENTION

An objective of the invention is to provide a heat sink backplate module to solve the problem of high temperature of the bottom of a circuit board with a heat source.

Another objective of the invention is to provide a circuit board having the heat sink backplate module mentioned above to reduce the temperature of the bottom of the circuit board effectively.

Another objective of the invention is to provide an electronic apparatus having a circuit board assembled with the heat sink backplate module mentioned above to improve the whole heat dissipation efficiency.

To achieve the above or other objectives, the invention discloses a heat sink backplate module to fasten a heat sink on a heat source of a circuit board. The heat source is disposed on a surface of the circuit board, and the heat sink backplate module is disposed on the other surface of the circuit board opposite to the heat source. The heat sink backplate module includes a body, at least one heat pipe, a fins assembly, and a first heat spreader. The body includes a plurality of holes corresponding to a plurality of openings surrounded the heat source, wherein the heat sink is fixed at the holes by a plurality of fixing elements passing through the openings. In addition, one end of the heat pipe is passed through the body, and the fins assembly is disposed on the other end of the heat pipe. The first heat spreader is disposed on a surface of the body and is suitable close to the circuit board.

In one embodiment of the invention, the heat sink backplate module further includes a second heat spreader disposed on another surface of the body. The circuit board is disposed in a case, and the second heat spreader is close to the case.

In one embodiment of the invention, the heat sink backplate module further includes at least one plate which is embedded into another surface of the body. The plate has a plurality of female threads in the holes, and the fixed elements of the heat sink are fixed in the female threads.

The invention also discloses a circuit board including a board and a heat source with a plurality of openings. The heat source is on a first surface of the board, and the heat sink backplate module is assembled on a second surface of the board opposite to the first surface. The openings surround the heat source and correspond to a plurality of holes of the hear-sink backplate module. The heat spreader disposed on a surface of the body is close to the board.

The invention also discloses an electronic apparatus including a case, a heat sink, a circuit board, and a heat sink backplate module. The circuit board is disposed in the case. The heat sink is disposed on a heat source of the circuit board, and the heat sink backplate module is disposed on a surface of the circuit board opposite to the heat source. The heat sink has a plurality of fixing elements fixed in holes of the heat sink backplate module.

In one embodiment of the invention, the heat sink backplate module further includes a second heat spreader disposed on another surface of the body and connected to the case.

In one embodiment of the invention, the fixing elements can be resilient clout nails.

In one embodiment of the invention, the heat sink backplate module further includes at least one plate embedded in another surface of the body. The plate has a plurality of female threads in the holes to fasten the fixing elements.

In one embodiment of the invention, the fixing elements can be spring screws.

In one embodiment of the invention, the electronic apparatus further includes a fan provided on the heat sink to produce an active flow for heat dissipation of the heat sink. Fins assembly is close to the heat sink, and suitable for the active flow passing.

According to the electronic apparatus of the invention, a heat spreader is disposed on a surface of the body of the heat sink backplate module, which surface is close to a circuit board. When the electronic apparatus in working, the heat from a heat source is conducted to the bottom of the circuit board and then conducted to a fins assembly by a heat pipe passing through the body. The heat may be dissipated to the outside by free convection or by forced convection via a fan, so that the temperature of the bottom of the circuit board is reduced. In addition, another heat spreader can be disposed on another surface of the body, which surface is close to a case, for heat conducting from the body to the case, and the heat can be dissipated to the outside by the heat exchange between the case and air.

These and other features, aspects, and advantages of the present invention will become better understood with regard to the following description, appended claims, and accompanying drawings.

DETAILED DESCRIPTION OF THE EMBODIMENTS

Figure 1A:
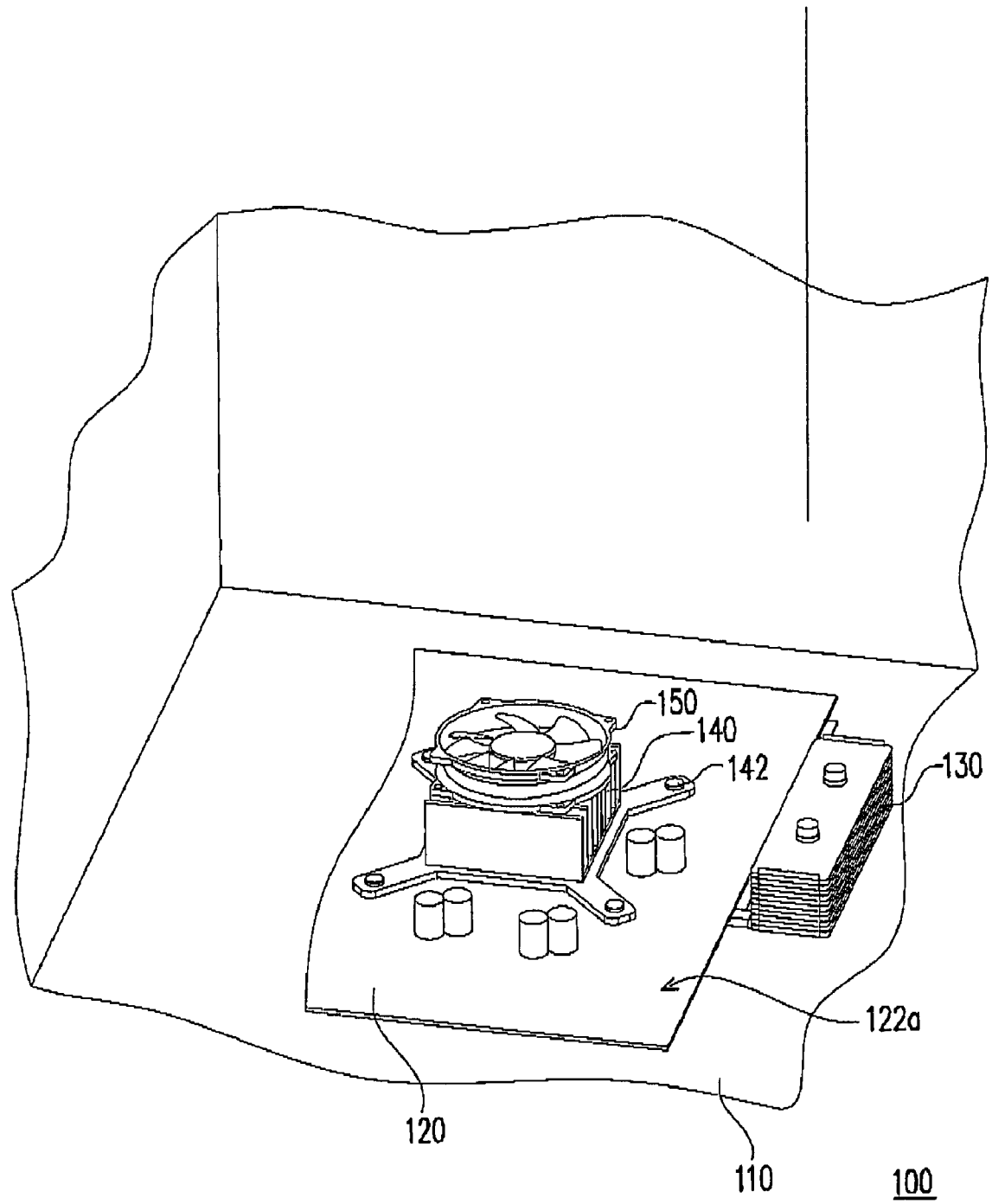
FIG. 1A is a partial view of the constitution diagram showing an electronic apparatus of an embodiment of the invention.
Figure 1B:
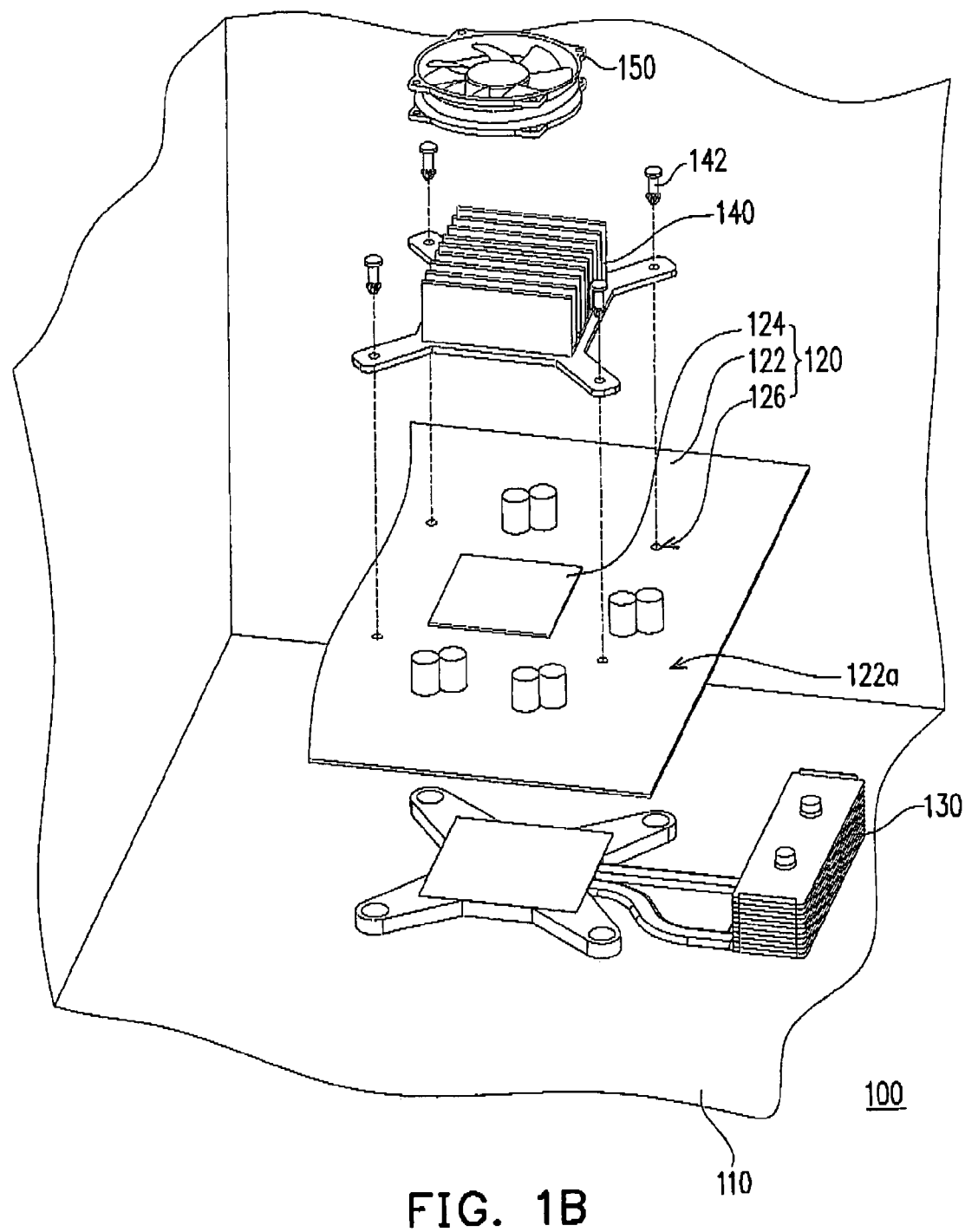
FIG. 1B is an exploded diagram showing the electronic apparatus according to FIG. 1A.
Figure 1C:
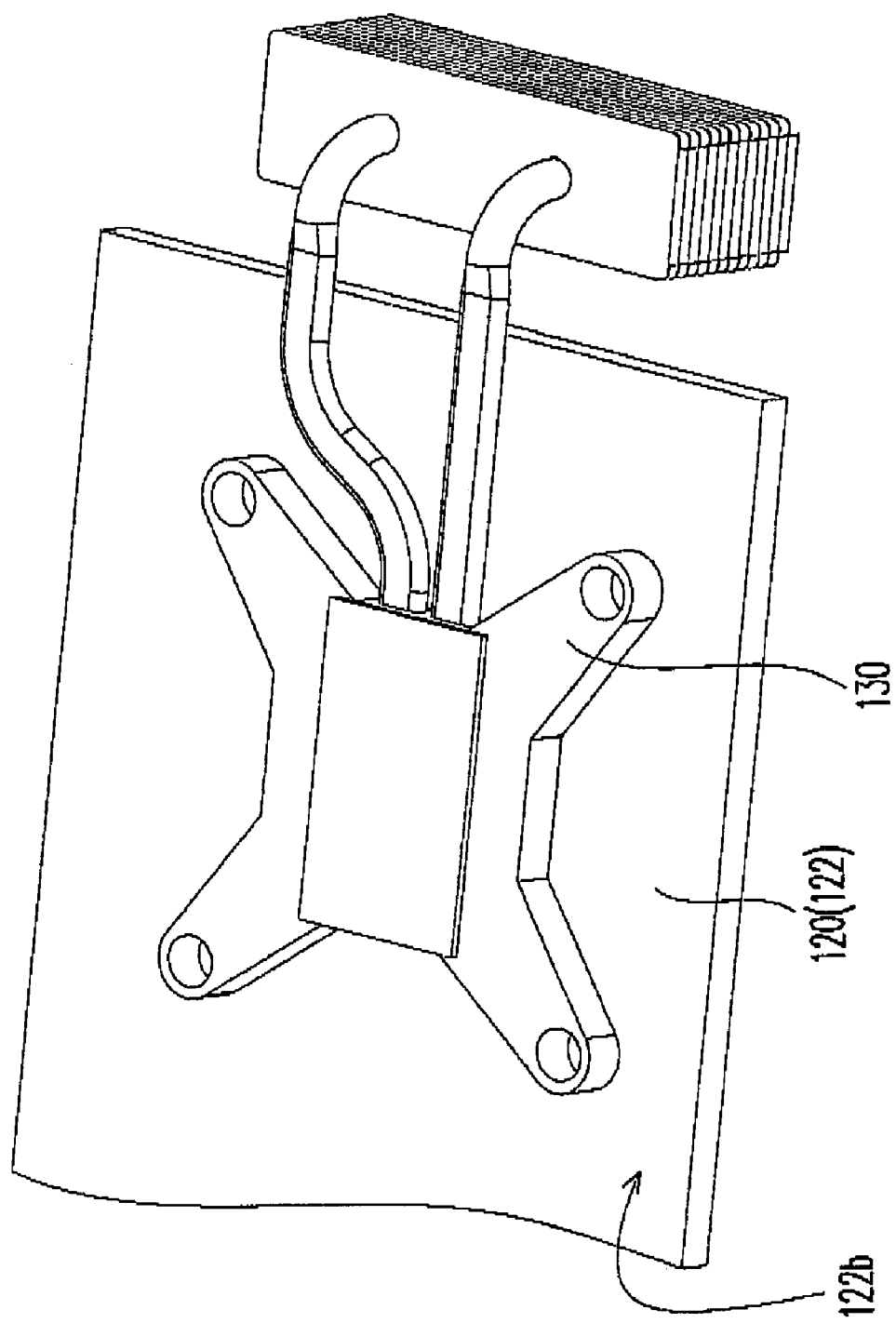
FIG. 1C is a constitution diagram showing the circuit board and the heat sink backplate module according to FIG. 1A in another view.

FIG. 1A is a constitution diagram showing an electronic apparatus of one embodiment of the invention. FIG. 1B is an exploded diagram showing the electronic apparatus according to FIG. 1A. FIG. 1C shows the constitution diagram in other view of the circuit board and the heat sink backplate module according to FIG. 1A. Please refer to FIGS. 1A, 1B, and 1C, the electronic apparatus 100 of the embodiment, such as a computer host, includes a case 110, a circuit board 120 disposed in the case, a heat sink backplate module 130, and a heat sink 140.

In the embodiment, the circuit board 120, such as a motherboard, includes a board 122, a heat source 124, and a plurality of openings 126 surrounding the heat source 124. The heat source 124 is disposed on a first surface 122a of the board 122, and the heat sink 140 is disposed on the heat source 124 for heat dissipation. The heat sink backplate module 130 is disposed on a second surface 122b of the board 122. A plurality of fixing elements 142 of the heat sink 140 pass through the openings 126 to be fixed on the heat sink backplate module 130, so that the structure strength of the circuit board is improved and the connection between the heat sink 140 and the heat source 120 is tighter. In the embodiment, the first surface 122a is on top of the board 122 and the second surface 122b is on bottom of the board 122.

The heat sink backplate module 130 of the embodiment is not only used to improve the structure strength of the circuit board 120, but also used to decrease the temperature of the bottom of the circuit board 120. In details, when the heat is conducted from the heat source 124 to the second surface 122b of the board 122, the heat sink backplate module 130 can conduct the heat on the second surface 122b efficiently. Therefore, the heat can be dissipated to the outside by the heat sink backplate module 130 and the temperature of the bottom of the circuit board 120 is decreased. The electronic elements (not shown) disposed on the circuit board 120 and being close to the heat source 124 then can work in normal working temperature. More details for the structure of the heat sink backplate module 130 and how it reduces the temperature of the bottom of the circuit board 120 are descried below.

Figure 2:
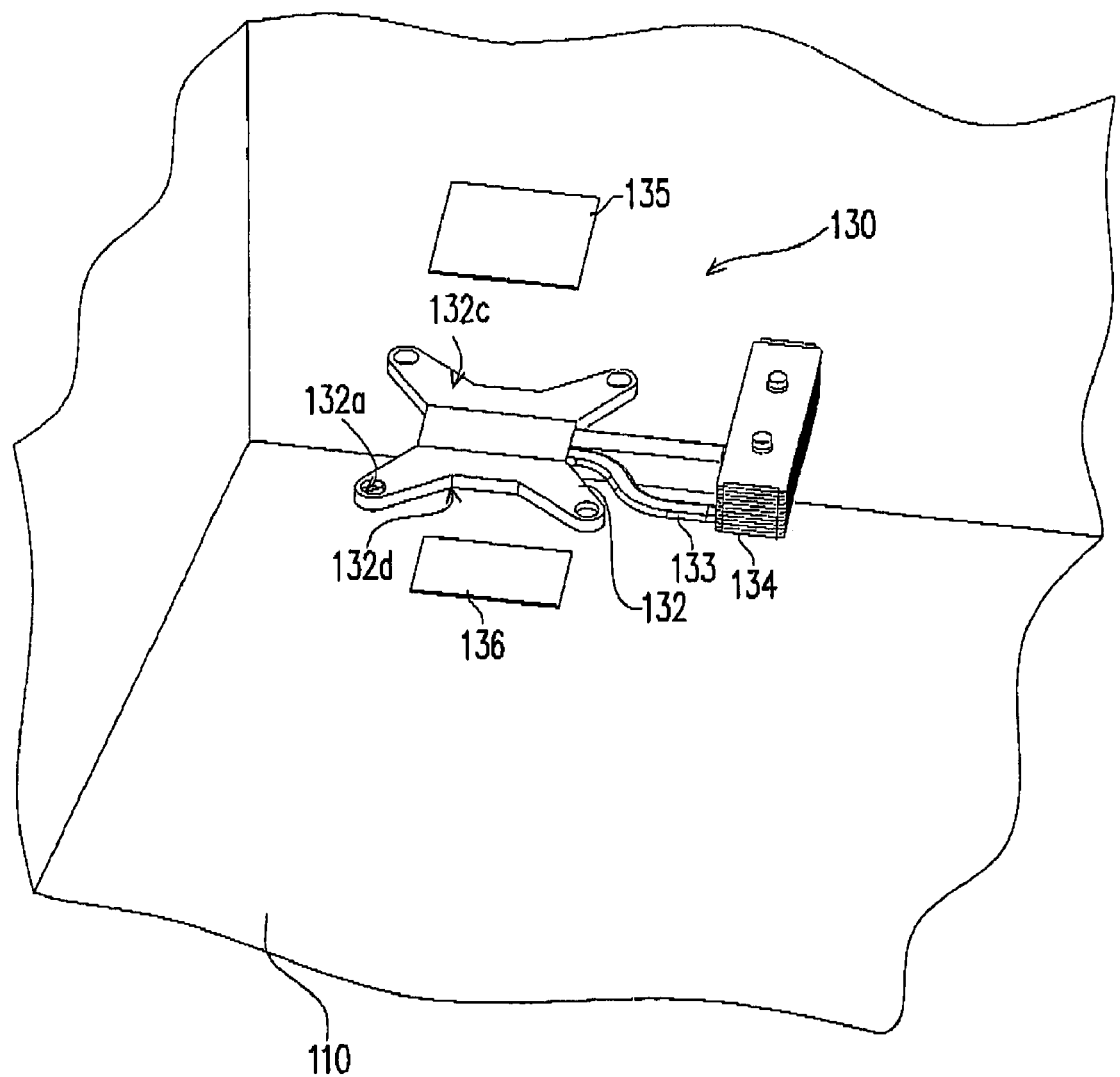
FIG. 2 is a partial view of the exploded diagram of the case and the heat sink backplate module shown in FIG. 1B.

FIG. 2 is a partial view of the exploded diagram of the case and the heat sink backplate module shown in FIG. 1B. Please refer to FIG. 1B and FIG. 2, the heat sink backplate module 130 of the embodiment includes a body 132, at least one heat pipe 133 (two heat pipes shown in FIG. 2), and a fins assembly 134. A plurality of holes 132a corresponded to the openings 126 are disposed on the body 132, and are used to fix the heat sink 140 by the plurality of fixing a elements 142 passing through the openings 126. In the embodiment, the fixing elements 142 can be resilient clout nails so that the heat sink 140 is disposed firmly on the heat source 124 by the connection between the fixing elements 142 and the holes 132a.

One end of the heat pipe 133 passes the body 132 through a groove (not shown), and the fins assembly is disposed at the other end of the heat pipe 133. Therefore, the heat conducted from the bottom of the circuit board 120 to the body 132 can be conducted to the fins assembly 134 by the heat pipe 133, and then dissipated to the outside by free convection so that the temperature of the bottom of the circuit board 120 is decreased efficiently. In addition, a fan 150 may be provided on the heat sink 140 to produce an active flow for heat dissipation of the heat sink 140. In one preferable embodiment, the heat pipe 133 can be bended, and the fins assembly 134 is on the exit of the flow of the heat sink 140. Therefore, the outgoing active flow can pass the fins assembly 134 again to remove the heat conducted from the bottom of the circuit board to the fins assembly 134.

From above, for efficient heat conducting from the bottom of the circuit board 120 to the body 132, a first heat spreader 135 with good thermo-conductivity can be disposed on a surface 132c close to the circuit board 120 of the body 132. Therefore, the heat from the circuit board 120 can be conducted to the body 132 efficiently by the first heat spreader 135 connected to the board 122, and then dissipated to the outside by the fins assembly 134. In another embodiment, a second heat spreader 136 can be disposed on another surface 132d close to the case 110 of the body 132. When the heat sink backplate module 130 touched the case 110, the heat passed from the bottom of the circuit board 120 to the body 130 can be conducted to the case 110 by the second heat spreader 136 connected to the case 110. Since the greater contact area between the case 110 and the air, the heat on the case 110 can be dissipated to the outside effectively and the temperature of the bottom of the circuit board 120 is reduced.

Figure 3A:
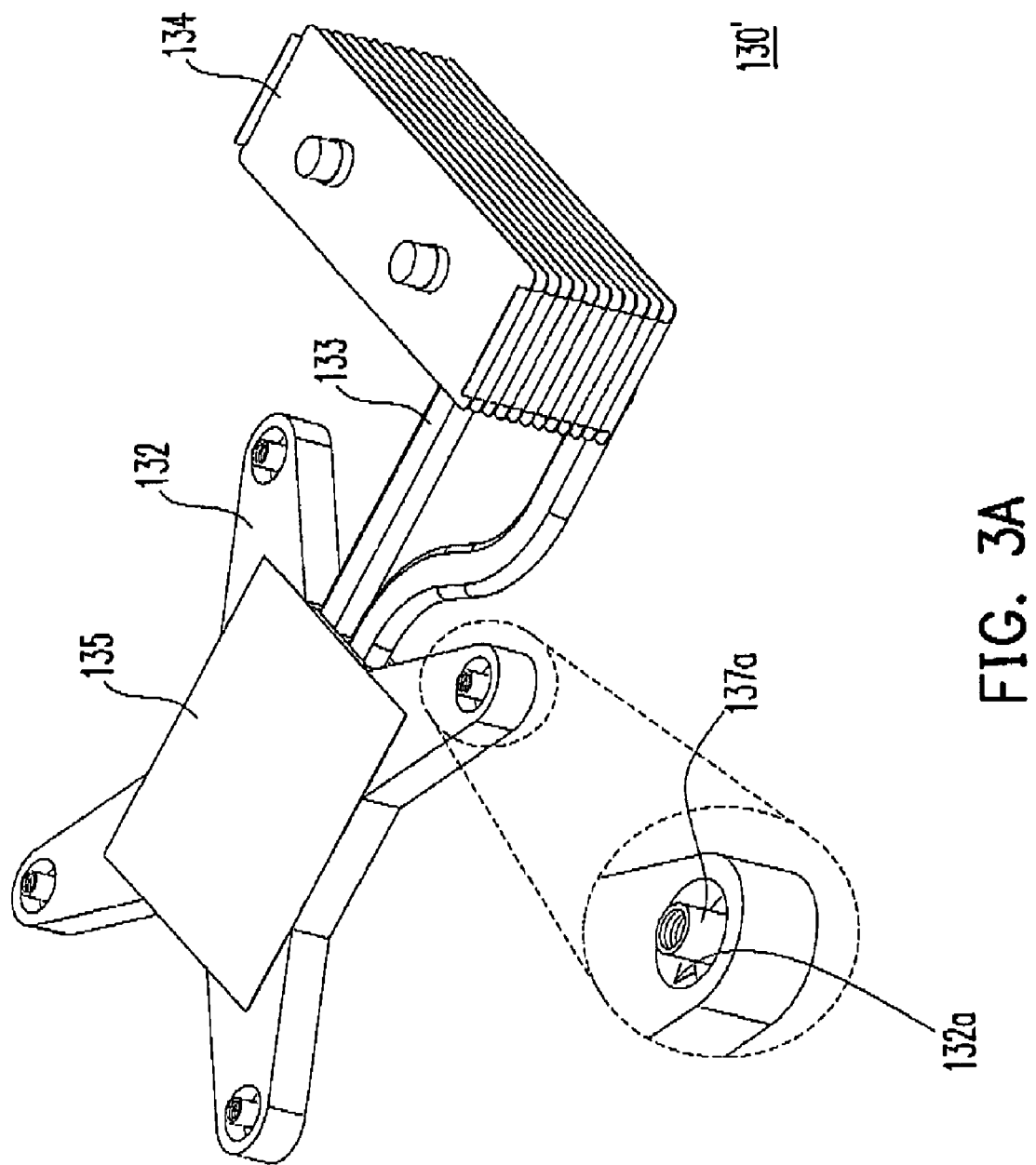
FIG. 3A is a constitution diagram showing another heat sink backplate module of an embodiment of the invention.
Figure 3B:
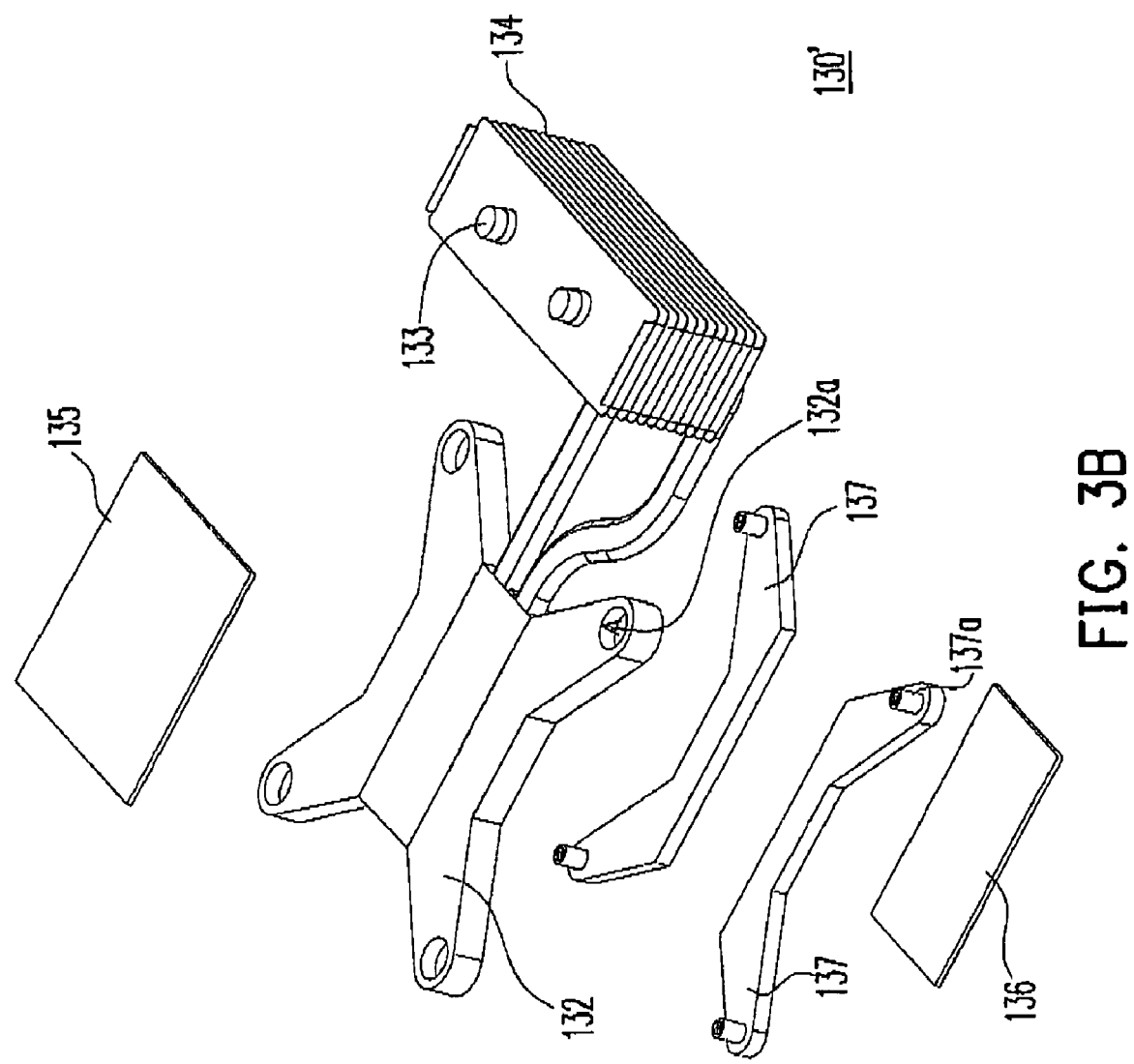
FIG. 3B is a partial view of the exploded diagram showing the heat sink backplate module shown in FIG. 3A.

FIG. 3A shows a constitution diagram for another heat sink backplate module of the embodiment of the invention, and FIG. 3B shows an exploded diagram in part of the heat sink backplate module according to FIG. 3A. Please refer to FIGS. 3A and 3B, a heat sink backplate module 130' of the embodiment is similar with the heat sink backplate module 130 mentioned above. The difference between them is the heat sink backplate module 130' is fixed by the fix elements such as spring screw, but the heat sink backplate module 130 mentioned above uses the fix element, such as the resilient clout nail, for fastening. In the embodiment, at least one plate 137 (two shown in FIG. 3B) is embedded at the surface 132d of the body 132, and each plate 137 has a plurality of female threads 137a which are suitable for assembling in the holes 132a. Accordingly, when the heat sink with the spring screw is assembling on the heat sink backplate module 130', the spring screw can be fixed in the female threads 137a successfully so that the heat sink can be fastened firmly on the heat source.

Figure 4:
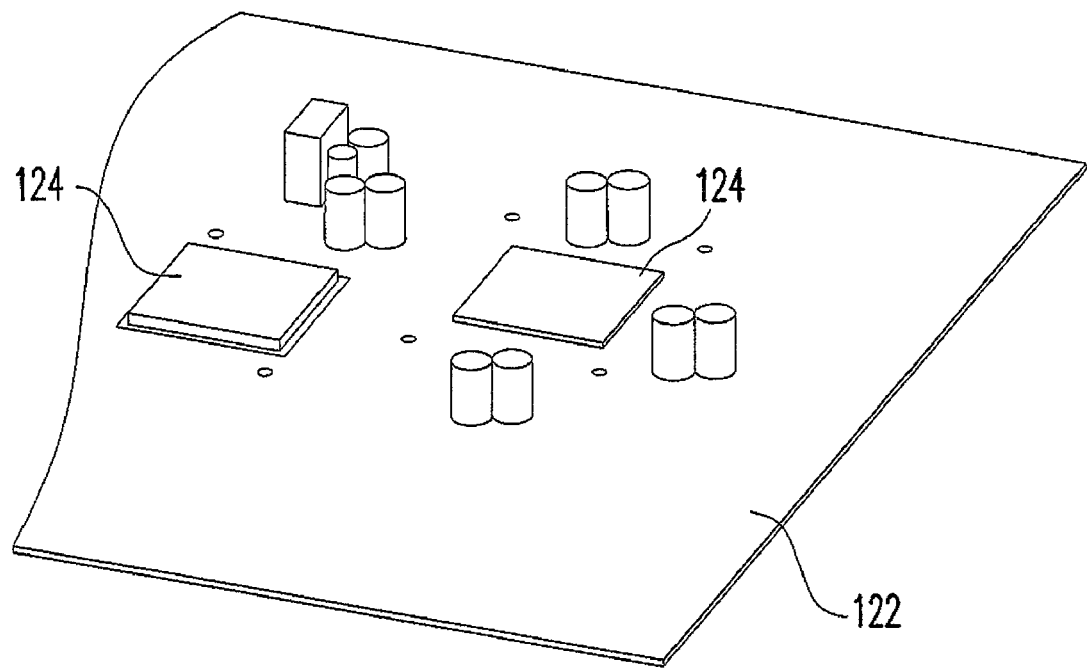
FIG. 4 is an exploded diagram showing another heat sink backplate module and a circuit board of an embodiment of the invention.
Figure 4:
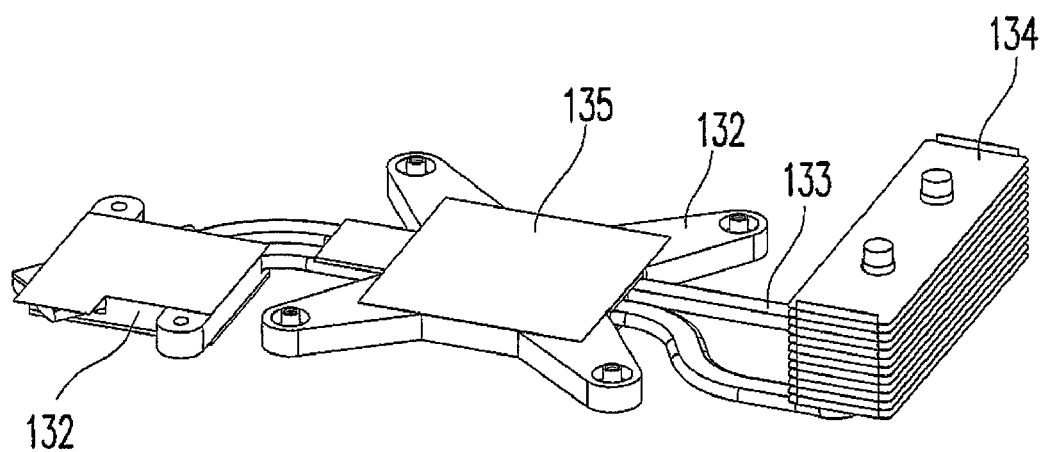

In another embodiment, many high thermal-power heat sources may be disposed on a circuit board, so the invention also provides a heat sink backplate module for heat conduction of the heat sources on a circuit board. Please refer to FIG. 4, it shows an exploded diagram of another heat sink backplate module and a circuit board of the embodiment of the invention. One or more bodies 132 can be disposed on the board 122 depending on the location of the heat sources 124, and can be connected to each other by the heat pipes 133. Therefore, the heat from the heat sources 124 to the board 122 can be conducted to the fins assembly 134 via the heat pipes 133, and then dissipated to the outside by the heat exchange between the fins assembly 134 and the air.

In summary, in an electronic apparatus provided by the embodiments of the invention, a heat spreader with good thermo-conductivity is disposed on a surface close to a circuit board of a body of a heat sink backplate module. Therefore, when the electronic apparatus is in working state, the heat conducted from a heat source to the bottom of the circuit board can be effectively conducted to the body via the heat spreader and then conducted to a fins assembly via a heat pipe passing through the body. Wherein, the heat conducted to the fins assembly can be dissipated to the external environment by free convection or forced convection so that the temperature of the bottom of the circuit board can be reduced effectively. In addition, another heat spreader can be disposed on a surface close to a case of the body, and the heat of the body can be conducted to the case via the heat spreader and then be dissipated to the external environment by the heat exchange between the case and air.

Compare with the current technology, the heat sink backplate module provided by the embodiments of the invention not only improves the structure strength of the circuit board but also reduces the temperature of the bottom of the circuit board by good thermal conductivity and convection.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat sink backplate module suitable for disposing a heat sink on a heat source of a circuit board, the heat source being on a surface of the circuit board, and the heat sink backplate module being disposed on another surface of the circuit board, wherein the heat source is surrounded by a plurality of openings, the heat sink backplate module comprising:
   a body having a plurality of holes corresponding to the openings, wherein the heat sink is fixed at the holes by a plurality of fixing elements passing through the openings;
   at least one heat pipe, on end of which passing through the body;
   a fins assembly disposed at the other end of the heat pipe;
   a first heat spreader disposed on a surface of the body, wherein the first heat spreader is close to the circuit board; and
   a second heat spreader disposed on another surface of the body, wherein the circuit board is disposed in a case and the second heat spreader is close to the case.

2. The heat sink backplate module according to claim 1, further comprising at least one plate embedded at another surface of the body and having a plurality of female threads in the holes of the body so that the plurality of fixing elements are fixed in the female threads.

3. An electronic apparatus, comprising:
   a case;
   a circuit board disposed in the case and having a heat source and a plurality of openings, the heat source being disposed on a surface of the circuit board and being surrounded by the openings;
   a heat sink backplate module disposed on another surface of the circuit board, the heat sink backplate module comprising:
   a body having a plurality of holes corresponding to the openings of the circuit board;
   at least one heat pipe, one end of which passing through the body;
   a fins assembly disposed at another end of the heat pipe;
   a first heat spreader disposed on a surface of the body and connected to the circuit board;
   a heat sink disposed on the heat source, wherein the heat sink can match with a plurality of fixing elements which are fixed in the holes; and
   a second heat spreader disposed on another surface of the body and close to the case.

4. The electronic apparatus according to claim 3, wherein the fixing elements are resilient clout nails.

5. The electronic apparatus according to claim 3, wherein the heat sink backplate module further comprises at least one plate embedded on another surface of the body, and the plate includes a plurality of female threads which are in the holes for fastening the fixing elements.

6. The electronic apparatus according to claim 3, further comprising a fan disposed on the heat sink to produce an active flow for heat dissipation of the heat sink, the fins assembly being close to the heat sink, and the active flow being suitable for passing through the fins assembly.

* * * * *